(12) United States Patent
Shahedipour-Sandvik et al.

(10) Patent No.: US 8,889,530 B2
(45) Date of Patent: Nov. 18, 2014

(54) FORMATION OF HIGHLY DISLOCATION FREE COMPOUND SEMICONDUCTOR ON A LATTICE MISMATCHED SUBSTRATE

(75) Inventors: Fatemeh Shahedipour-Sandvik, Clifton Park, NY (US); Di Wu, Bothell, WA (US); Jamil Kahn Muhammad, Albany, NY (US)

(73) Assignee: The Research Foundation of State University of New York, Albany, NY (US)

( * ) Notice: Subject to any disclaimer, the term of this patent is extended or adjusted under 35 U.S.C. 154(b) by 951 days.

(21) Appl. No.: 11/342,095

(22) Filed: Jan. 27, 2006

(65) Prior Publication Data

US 2006/0237744 A1   Oct. 26, 2006

Related U.S. Application Data

(63) Continuation-in-part of application No. 10/563,179, filed as application No. PCT/US2004/016481 on May 25, 2004, now abandoned.

(60) Provisional application No. 60/705,084, filed on Aug. 3, 2005, provisional application No. 60/475,552, filed on Jun. 3, 2003.

(51) Int. Cl.
| | |
|---|---|
| *H01L 21/20* | (2006.01) |
| *H01L 21/36* | (2006.01) |
| *H01L 21/02* | (2006.01) |
| *C30B 25/18* | (2006.01) |
| *C30B 29/40* | (2006.01) |
| *C30B 25/02* | (2006.01) |
| *H01L 33/00* | (2010.01) |

(52) U.S. Cl.
CPC ............ *C30B 25/02* (2013.01); *H01L 21/0254* (2013.01); *H01L 21/02458* (2013.01); *H01L 21/02658* (2013.01); *C30B 25/183* (2013.01); *C30B 29/403* (2013.01); *H01L 33/007* (2013.01); *H01L 21/02513* (2013.01); *H01L 21/0237* (2013.01); *H01L 21/02381* (2013.01)
USPC ............ 438/483; 438/478; 438/480; 438/488

(58) Field of Classification Search
CPC .............. H01L 21/0254; H01L 33/007; H01L 21/02658; H01L 21/02694; H01L 21/02505; H01L 21/02538
USPC .................................. 438/478, 480, 483, 488
See application file for complete search history.

(56) References Cited

U.S. PATENT DOCUMENTS

| | | | |
|---|---|---|---|
| 4,845,044 A | 7/1989 | Ariyoshi et al. | 437/24 |
| 5,141,894 A | 8/1992 | Bisaro et al. | 437/132 |

(Continued)

FOREIGN PATENT DOCUMENTS

| | | | |
|---|---|---|---|
| FR | 2774511 | 8/1999 | H01L 23/14 |

OTHER PUBLICATIONS

Patent Abstracts of Japan, vol. 0110, No. 17, Jan. 17, 1987 & JP 61 189621, Aug. 23, 1986.

*Primary Examiner* — Shouxiang Hu (74) *Attorney, Agent, or Firm* — Heslin Rothenberg Farley & Mesiti P.C.

(57) ABSTRACT

A highly dislocation free compound semiconductor, e.g. $Al_xIn_yGa_{1-x-y}N$ (0≤x, y≤1), is formed on a lattice mismatched substrate, e.g. Si, by first depositing a polycrystalline buffer layer on the substrate. A defective layer is then created at or near the interface of the substrate and the polycrystalline buffer layer, e.g. through ion implantation. A monocrystalline template layer of the compound semiconductor is then created on the buffer layer, and an epilayer of the compound semiconductor is grown on the template layer. A compound semiconductor based device structure may be formed in the epilayer.

23 Claims, 4 Drawing Sheets

(56) References Cited

U.S. PATENT DOCUMENTS

| | | | |
|---|---|---|---|
| 6,032,611 A | 3/2000 | Asakawa et al. | 118/723 |
| 6,168,659 B1 * | 1/2001 | Yuri et al. | 117/89 |
| 6,392,257 B1 | 5/2002 | Ramdani et al. | 257/190 |
| 6,464,780 B1 | 10/2002 | Mantl et al. | 117/90 |

* cited by examiner

FORMATION OF HIGHLY DISLOCATION FREE COMPOUND SEMICONDUCTOR ON A LATTICE MISMATCHED SUBSTRATE

CROSS-REFERENCE TO RELATED APPLICATIONS

This application is a continuation-in-part of the U.S. national phase application Ser. No. 10/563,179, filed Dec. 30, 2005, corresponding to International Application PCT/US2004/016481 filed May 25, 2004 and published in English as International Publication WO/2004/109775 A2 on Dec. 16, 2004, and claims priority from U.S. provisional application No. 60/475,552 filed on Jun. 3, 2003 and U.S. provisional application No. 60/705,084 filed on Aug. 3, 2005, all of which applications are hereby incorporated by reference herein in their entirety.

FIELD OF THE INVENTION

This invention relates generally to the field of semiconductor fabrication, and more particularly to a method of forming a highly dislocation free compound semiconductor on a lattice mismatched substrate, and to the resulting semiconductor structure/device.

BACKGROUND ART

Growth of high quality thin films of compound semiconductor on substrates with high lattice and thermal expansion coefficient mismatch with the epitaxial thin film layer, such as III-V nitrides on Si, SiC and sapphire substrates, has shown to be very challenging.

III-V nitride is a field of intense research due to its wide applications for optoelectronic and electronic devices, such as blue and UV light emitting diodes (LEDs) and Laser diodes (LDs), UV detectors and electronic devices such as bipolar transistors. Compared with the currently used and available devices on the market, nitride devices have marked advantages in several aspects. For example, nitride blue laser can provide at least a 400% increase in data storage density on a CD RAM due to its shorter wavelength than those of red and near infrared lasers. On the other hand, the large bandgap of III-V nitride materials make them good candidates for high power and high temperature transistor applications.

Currently, one of the main remaining problems of III-V nitride materials is the unacceptable high dislocation density due to large lattice and thermal expansion coefficient mismatch between them and substrates (e.g. 16.09% and 17% between GaN and sapphire, and GaN and Si(111), respectively, the most widely used substrates for III-V nitrides). High dislocation density dramatically degrades the performance and reliability of nitride devices and shortens device lifetime.

Figure 1:
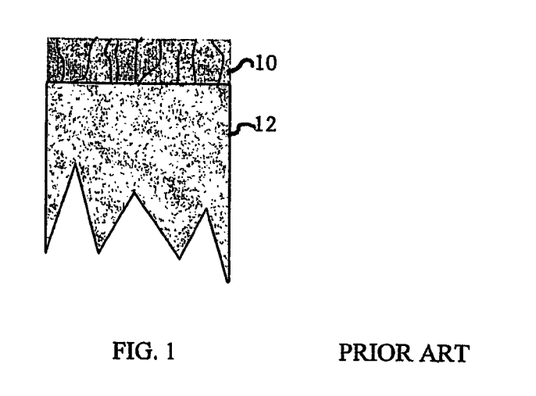
FIG. 1 depicts a prior art semiconductor structure of an epilayer with high dislocation density on a substrate.

In prior methods, a low temperature $Al_xIn_yGa_{1-x-y}N$ ($0<x$, $y<1$) buffer layer is used, as described by H. Amano, et al, Appl. Phys. Lett., Vol. 48, 35 (1986) and S. Nakamura, Jpn. J. Appl. Phys Vol. 30, L1705 (1991), which has dramatically improved the III-V nitride epilayer quality in terms of morphology, electrical and optical properties. Other methods such as lateral epitaxial overgrowth (LEO) and Pendeoepitaxy (PE) have also shown success in reducing the dislocation density. However, both the LEO and PE methods require several additional processing steps before a low dislocation epitaxial layer of the material can be obtained. Despite the use of a buffer layer as proposed by Nakamura et al. and Amano et al., the dislocation density in as-grown nitride epilayers is still very high ($10^8$ to $10^9$ cm$^{-2}$) as diagrammatically illustrated in epilayer 10 on substrate 12 in FIG. 1, which limits nitride device performance and applications.

Figure 2:
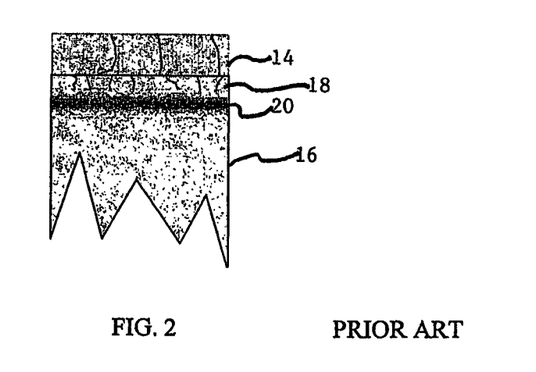
FIG. 2 illustrates a prior art semiconductor structure having an epilayer on a compliant universal substrate.

To solve this problem, it has been proposed to use a compliant universal (CU) substrate by Lo in U.S. Pat. No. 5,294,808 and Hwang et al in U.S. Pat. No. 6,406,795. If an epilayer is grown on a very thin substrate, the misfit dislocations (due to both lattice and thermal expansion coefficient mismatch) will propagate into and are contained in the thin CU substrate rather than the epilayer since it is energetically more favorable. An example of a layer 14 of $Al_xIn_yGa_{1-x-y}N$ grown on a Si SOI (Semiconductor On Insulator) substrate 16, is schematically shown in FIG. 2, in which the thin Si overlayer 18, above a buried oxide layer 20, serves as a thin free-standing substrate. If the thickness of the Si overlayer is lower than its critical thickness, an ideal CU substrate is achieved and the stress between the overgrown epitaxial $Al_xIn_yGa_{1-x-y}N$ layer and the thin Si overlayer will not exceed the critical value that leads to the generation of dislocations at their interface.

The advantage of using a CU substrate is that it is universal and different epilayers can be grown on the same CU substrate. However, the disadvantages of this approach for growth of III-V Nitride materials include:

(1) For $Al_xIn_yGa_{1-x-y}N/Si$ heterostructure the critical thickness of Si is around one monolayer, therefore, no ideal CU substrate can be fabricated in this case. With the typical Si overlayer thickness of about 50 to 200 nm, some dislocations will be generated at the interface some of which will penetrate into the overgrown epilayer 14, as schematically illustrated in FIG. 2.

(2) The thin Si overlayer on the top of $SiO_2$ may not give enough guiding force to epitaxial growth of polycrystalline $Al_xIn_yGa_{1-x-y}N$ seeding layer (buffer layer) which leads to a low crystal quality in the buffer layer. A thin Si overlayer does not support epitaxial relationship (lattice structure and orientation) needed in high quality $Al_xIn_yGa_{1-x-y}N$ buffer layer. Quality of the subsequent III-V Nitride layers depend highly on the quality of the seeding (buffer) layer.

Other techniques have been suggested to reduce dislocation density in a top monocrystalline layer as proposed by Bisaro (U.S. Pat. No. 5,141,894) by Mantl (U.S. Pat. No. 6,464,780 B1) and Ramdani (U.S. Pat. No. 6,392,257 B1).

In these earlier patents, monocrystalline buffer layers have been used. However, growth of a monocrystalline AlInGaN thin buffer layer on Si substrate is highly improbable due to the high lattice and thermal mismatch between the two layers and therefore is not suitable in this application.

The Bisaro patent further describes an embodiment in which a monomolecular preliminary layer is deposited on a substrate, e.g. silicon. The substrate is then implanted through the preliminary layer to create a highly disturbed or even amorphous zone on the surface of the silicon. It is also mentioned that the preliminary layer can also be a thicker amorphous layer. The preliminary layer is used to stabilize the silicon surface and to protect the silicon in the implantation stage only. It does not play the role of a seeding layer for the following monocrystalline layer growth after ion implantation.

Further, ion implantation will usually cause significant damage to a monocrystalline layer. In the Bisaro patent, it is not mentioned at all how to keep the buffer layer monocrystalline during ion implantation process. In the Mantl patent, light element (hydrogen) ion implantation with low dose is suggested in order to minimize the damage to the monocrystalline buffer layer, which is feasible, but it is not applicable for high dose ion implantation as needed for this application. Also in the Mantl approach, the monocrystalline epitaxial layer is not disconnected "mechanically" from its substrate and, therefore there is always stress and dislocations present in the layers if the layer thickness exceeds critical dimension.

In Ramdani, an amorphous intermediate oxide layer is generated by thermal diffusion of oxygen through the thin monocrystalline oxide/nitride accommodating buffer layer, eventually reacting with the monocrystalline substrate at the interface to create the oxide layer. Thermal diffusion of oxygen at temperatures of 400° C.-600° C. (as suggested by Ramdani in column 8, line 62) through a monocrystalline layer of GaN with a practical thickness of 20 nm is a very lengthy procedure.

Thus, a need persists for a practical and cost effective method for forming a highly dislocation free compound semiconductor such as $Al_xIn_yGa_{1-x-y}N$, on a lattice mismatched substrate.

SUMMARY OF THE INVENTION

According to the principles of the present invention, the shortcomings of the prior art are overcome, and a highly dislocation free compound semiconductor can be formed on a lattice mismatched substrate by: depositing a polycrystalline buffer layer on the substrate; then creating a defective layer in the substrate at or in a vicinity of an interface of the substrate and the polycrystalline buffer layer; and creating a monocrystalline template layer of the compound semiconductor on the buffer layer. The method may further include growing an epilayer of the compound semiconductor on the template layer.

The defective layer comprises a polycrystalline and/or amorphous material, and is preferably created by ion implantation, either through the polycrystalline buffer layer, or by back-side ion implantation through the substrate.

In a preferred embodiment, the defective layer comprises an amorphous oxide layer created by oxygen ion implantation; the polycrystalline buffer layer and the template layer exhibit homoepitaxy, or are closely lattice matched and/or comprise the same material; and the compound semiconductor comprises a III-V material, such as $Al_xIn_yGa_{1-x-y}N$ ($0 \le x$, $y \le 1$).

In the present invention, the buffer layer serves as a seed layer for growth of the template layer, which, in turn, supports subsequent growth of compound semiconductor based device structures in an epilayer. The defective layer serves to "mechanically" separate the compound semiconductor epilayer and the substrate. This separation will make the compound semiconductor layer "floating" on the substrate and the strain between the epilayer and the substrate will be released, which in principle will lead to a highly dislocation free (dislocation density<$10^7$ cm$^2$, and preferably <$10^5$ cm$^{-2}$) compound semiconductor epilayer on the substrate.

In another aspect, the present invention provides a semiconductor structure comprising a semiconductor substrate; a polycrystalline buffer layer on the substrate; a defective layer at or in the vicinity of an interface of the substrate and the buffer layer; and an epilayer of monocrystalline compound semiconductor on the buffer layer. The epilayer generally includes a monocrystalline template layer of the compound semiconductor grown on the buffer layer. Advantageously, the epilayer may comprise a compound semiconductor based device structure. In a preferred embodiment, the defective layer comprises an amorphous oxide layer, the buffer layer and epilayer are homoepitaxial or closely lattice matched and/or comprise the same material, and the compound semiconductor may comprise $Al_xIn_yGa_{1-x-y}N$ ($0 \le x$, $y \le 1$).

In another aspect, a semiconductor structure of the present invention may comprise a semiconductor substrate; a polycrystalline buffer layer on the substrate; a defective layer at or in a vicinity of an interface of the substrate and the buffer layer; and a monocrystalline template layer of compound semiconductor on the buffer layer. In a preferred embodiment, the defective layer comprises an amorphous oxide layer, the buffer layer and template layer are homoepitaxial or closely lattice matched and/or comprise the same material, and the compound semiconductor comprises $Al_xIn_yGa_{1-x-y}N$ ($0 \le x$, $y \le 1$), with a dislocation density<$10^5$ cm$^{-2}$.

BRIEF DESCRIPTION OF THE DRAWINGS

Further aspects, features and advantages of the present invention will be readily apparent from the following detailed description, when read in conjunction with the accompanying drawings, in which.

DETAILED DESCRIPTION

The present invention is generally directed to a method for forming or fabricating a highly dislocation free compound semiconductor on a lattice mismatched substrate. In this method, a polycrystalline buffer layer is first deposited on the substrate, and then a defective layer is created at or in the vicinity of the interface between the substrate and the buffer layer, preferably by ion implantation. The resulting "floating" buffer layer serves as a seed layer for the growth of a high quality monocrystalline template layer and highly dislocation free compound semiconductor epilayer thereon.

By way of example, application of the method of the present invention to the formation of a highly dislocation free $Al_xIn_yGa_{1-x-y}N$ ($0 \le x$, $y \le 1$) based device structure on an exemplary silicon substrate, will now be described.

The current invention presents a new scheme of strain and dislocation defects reduction by creating a defective layer in the Si substrate with N$^+$ or O$^+$ ion implantation of an AlN/Si substrate. This approach relies on the idea that the presence of a highly defective or an amorphous layer below the AlN/Si interface can reduce the tensile stress and dislocation defects in the subsequent GaN film. This highly defective layer helps in the partial mechanical and crystallographic separation of the III-Nitride layer from the bulk Si substrate. The presence of the highly defective layer at or near the AlN/Si interface gives relatively more freedom to III-Nitride buffer nuclei to migrate and reorient while complying with the GaN epilayer, resulting in reduced threading dislocations and strain in the epitaxial layer. Implantation also provides the ability to control the thickness and position of the defective layer through controlling energy and dose of the implanted ions, contrary to relying on available thickness of seed layer as is the case of a SOI substrate. Moreover, damage to the AlN buffer layer after ion implantation can be annealed out.

An important and distinguishing step of the inventive process is that the implantation is performed after buffer layer growth rather than growth of the buffer and high temperature monocrystalline GaN on a SOI (silicon on insulator) substrate. Being thus able to form a highly dislocation free compound semiconductor, such as GaN, on a silicon substrate affords significant benefits including cost effectiveness, high yield and integration of GaN based optoelectronics with matured Si electronics.

Figure 3:
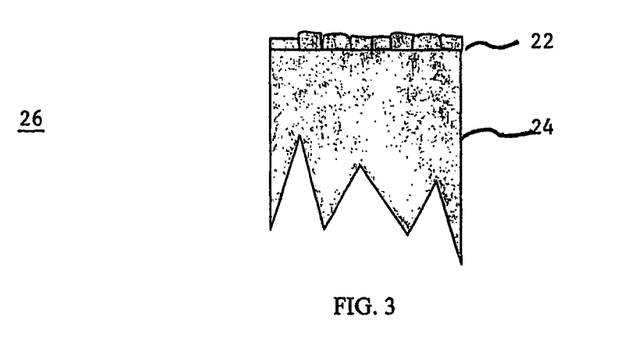
FIG. 3 depicts the deposition of a polycrystalline buffer layer on a substrate, in accordance with the principles of the present invention.

As shown in FIG. 3, a thin buffer layer 22 (e.g. 20 to 50 nm) of polycrystalline $Al_xIn_yGa_{1-x-y}N$ (0≤x, y≤1) is deposited on a silicon (Si) substrate 24 at a low temperature (e.g. 500° C. using a MOCVD system) in a deposition system (not shown) such as metalorganic chemical vapor deposition (MOCVD) reactor or by molecular beam epitaxy (MBE). The purpose of buffer layer 22 is two fold. First, it serves as the seeding layer for the subsequent growth of a monocrystalline, high-temperature $Al_xIn_yGa_{1-x-y}N$ epitaxial layer (e.g. a thickness of higher than 500 nm), with high lattice matching between a monocrystalline template layer and the seeding layer. Secondly, it is compatible with oxygen ion implantation, i.e. its crystalline properties are not significantly changed by such ion implantation.

The sample 26 is then removed from the deposition system and a defective layer, e.g. an amorphous oxide layer $SiO_x$ 28, is formed in the Si substrate at the interface of the buffer layer 22 and the Si substrate 24 (i.e. with no Si overlayer above the oxide layer) or in the vicinity of. The known Separation-by-Implanted-Oxygen (SIMOX) method may be used for the formation of the amorphous oxide layer. The oxygen ion dose should be kept below the limit of amorphization of AlInGaN (about $8 \times 10^{15}$ cm$^{-2}$). It is also preferable that the implantation be performed at elevated temperatures (e.g. several hundred degrees Celsius) for lowering any damage to the AlInGaN buffer layer 22 due to high energy ion implantation. The elevated temperature of ion implantation should be kept below the critical re-crystallization temperature of the amorphous oxide layer (i.e. below 800° C.).

Figure 4:
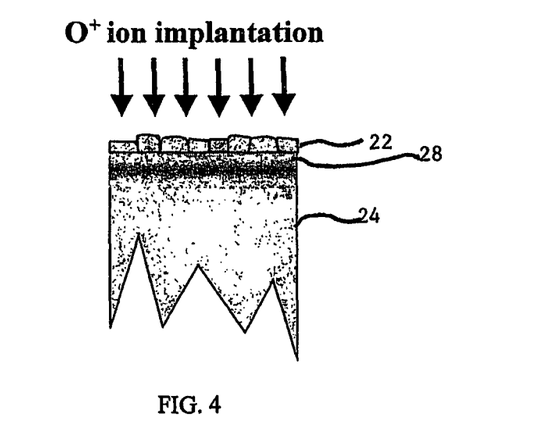
FIG. 4 depicts the creation of a defective layer at or in the vicinity of the interface between the buffer layer and substrate, by ion implantation through the buffer layer.
Figure 5:
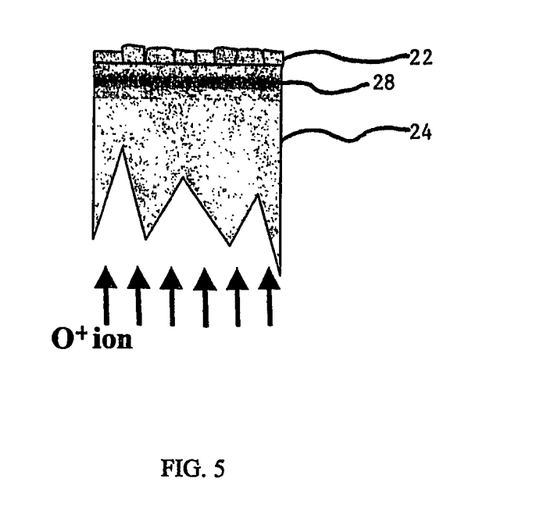
FIG. 5 depicts an alternative approach for creating a defective layer at or in a vicinity of the interface between the buffer layer and the substrate, by back-side ion implantation through the substrate.

The ion implantation of the interface layer can be performed from either the top (through the buffer layer 22 as shown in FIG. 4) or bottom side (through the substrate 24 as shown in FIG. 5).

By oxygen ion implantation, the amorphous layer 28 is created that mechanically separates the lattice mismatched substrate 24 from the polycrystalline buffer layer 22 enabling a "floating" buffer layer for subsequent growth of a monocrystalline AlInGaN template layer, free from stress and dislocations and preferably lattice matched to the buffer layer.

Since polycrystalline materials are more flexible for structural arrangements, the polycrystalline AlGaInN buffer layer will only suffer minor damage by ion implantation, if implanted from the buffer layer side (top side) and can be easily cured through thermal annealing. Moreover, the ion beam irradiation in the present invention might even be beneficial for the buffer layer in the sense that the beam may reshape the size of the grains of the polycrystalline AlGaInN buffer layer to make them more uniform which will enhance the uniformity of the following epitaxial growth of an AlInGaN monocrystalline template layer.

In the variation shown in FIG. 5, the oxygen ion implantation can be done from the substrate side, preferably after thinning the substrate to less than 200 microns. This method is advantageous because of its lower impact on causing possible damage to the polycrystalline buffer layer 28. In the back-side implantation, there will be no limit on the dose of the oxygen for implantation, which will lead to better and more continuous $SiO_2$ layer at the interface of the AlGaInN buffer layer 22 and the Si substrate 24, thus better mechanical isolation between them.

Figure 6:
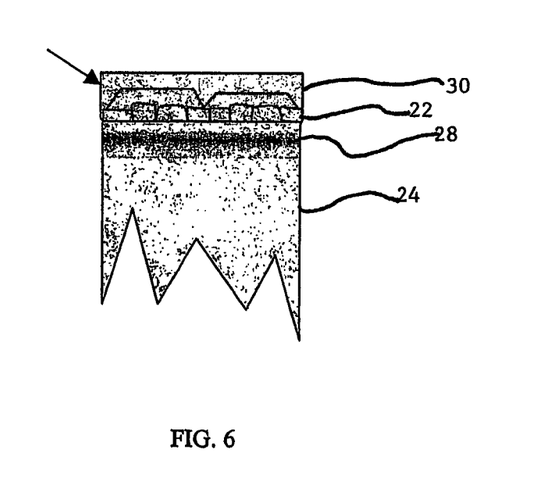
FIG. 6 depicts the creation of a template layer on the buffer layer, according to the method of the present invention.
Figure 7:
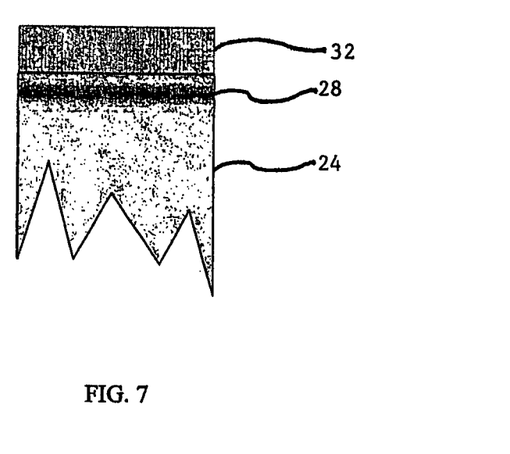
FIG. 7 schematically illustrates the formation of the highly dislocation free epilayer of the present invention.

The sample (buffer layer 22 on amorphous oxide layer 28 on Si substrate 24) is then loaded into the deposition system for regrowth. As shown in FIG. 6 and discussed in greater detail hereinafter, a highly dislocation free template layer 30, preferably lattice matched to the polycrystalline buffer layer 22, of monocrystalline $Al_xIn_yGa_{1-x-y}N$ with a thickness of about 1-3 μm is then created on the "floating" $Al_xIn_yGa_{1-x-y}N$ (seeding) buffer layer 22. This highly dislocation free $Al_xIn_yGa_{1-x-y}N$ layer 30 will in turn be used as the template layer for the subsequent growth of a highly dislocation free epilayer 32 of $Al_xIn_yGa_{1-x-y}N$ (see FIG. 7), and $Al_xIn_yGa_{1-x-y}N$-based device structures (see FIG. 8).

The device structures that can be potentially grown on the template layer include light emitters (light emitting diode and laser diode), photo detectors and sensors, solar cells matching the solar spectrum, high power and high frequency electronic devices, transistors, and quantum effect and high speed devices.

Figure 8:
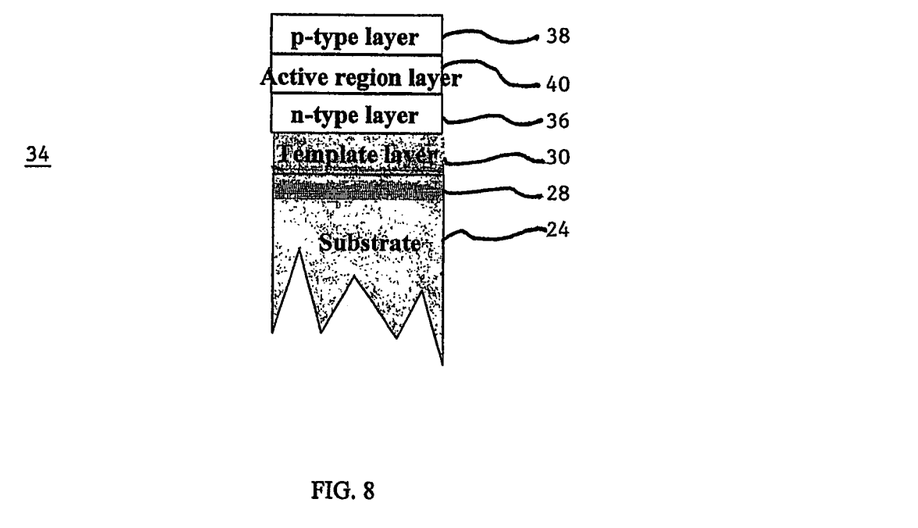
FIG. 8 shows the formation of a compound semiconductor based device structure in the epilayer.

A general structure for a photo detector and light emitting diode or laser diode structure is schematically shown in FIG. 8 and includes a n-type layer 36, a p-type layer 38 sandwiching an active (e.g. undoped) region 40. The device structure may, of course, take different forms.

To develop high nuclei density of polycrystalline $Al_xIn_yGa_{1-x-y}N$ buffer layer on Si substrate, it is desirable, during the growth of AlInGaN on Si, to prevent formation of $SiN_x$ on Si. Formation of $SiN_x$ takes place due to competition between interaction of the Si substrate with nitrogen and formation of GaN on Si. The prevention of formation of $SiN_x$ is important because the presence of $SiN_x$ on Si will prevent formation of GaN layers on Si.

To this end, polycrystalline AlN has been deposited on a silicon substrate at a temperature of about 1000° C. and growth initiation using six seconds of trimethy aluminum (TMAI) pulse in a MOCVD system, to form the thin polycrystalline buffer layer. The amorphous layer may be formed by nitrogen ion implantation, e.g. 50 keV of nitrogen ions with a dose density of about $2 \times 10^{16}$ cm$^{-2}$ at temperatures of 200° C. to 300° C. A thin dielectric mask on the AlN buffer layer may be used to prevent or reduce damage from implantation.

A specific example of the method of the present invention will now be described.

EXAMPLE

AlN buffer layers were grown on Si(111) substrates using a D75 Veeco MOCVD reactor. Trimethylgallium (TMGa), trimethylaluminum (TMAI) and ammonia ($NH_3$) were used as precursors with $H_2$ as the carrier gas. Si substrates were chemically etched for 30 seconds in 7% HF to remove the oxide layer and to produce a hydrogen terminated surface. They were further in-situ annealed for 20 minutes at 1100° C. in $H_2$ ambient followed by exposure to TMAI for 6 second in order to prevent the formation of a $Si_xN_y$ layer. AlN buffer layers of various thicknesses (165, 110, 55 and 15) nm were grown at 50 torr and 1050° C. using $NH_3$ and TMAI. The implantation of 75 keV-60 keV N$^+$ ions in the dose range 5×10$^{14}$/cm$^2$-2×10$^{16}$/cm$^2$ was carried out into AlN/Si at room temperature with a current density of ~0.2 μA/cm$^2$. After implantation, samples were annealed at 1100° C. for 30 minutes to recover the buffer layers from implantation damage. Afterwards, a 2 μm thick GaN layer was grown at 1050° C. on both implanted and non-implanted samples under same growth conditions.

For the growth of 2 μm thick GaN, the substrate with the deposited polycrystalline AlN buffer layer on it is placed on a silicon carbide coated graphite susceptor and is transferred into the growth chamber (i.e. MOCVD system). The susceptor is then ramped to a rotation of ~1000 rpm (rotations per minute) under NH$_3$ (ammonia) with a flow rate of 3 lpm (liter per minute) and H$_2$ (hydrogen) with a flow rate of 3 lpm ambient. The sample temperature is then ramped to about 1050° C. under flow of ammonia and hydrogen. During the temperature ramp the polycrystalline AlN buffer layer can be further crystallized by the heating treatment and overpressure of nitrogen (existence of nitrogen species from dissociation of ammonia). During the heating treatment three dimensional (3D) AlN nuclei make a transition to 2D layer through lateral growth. Subsequent growth at higher temperature (e.g. 1050° C.) results in epitaxial growth of monocrystalline AlInGaN template when Al, In and Ga precursors, namely trimethyl Aluminum (TMAl), trimethyl Indium (TMIn) and Trimethyl Gallium (TMGa) are introduced into the growth chamber at high temperature (e.g. 1050° C.).

For example for the growth of GaN template, after growth of AlN or GaN buffer layer deposited at low temperature (550° C.) the sample is heated under flow of ammonia and hydrogen to higher temperature (1050° C.). Gallium precursor (TMGa) with a flow rate of about 50 micromol per minute is then introduced into the growth chamber at 1050° C. for a period of 30 minutes to achieve a smooth, monocrystalline GaN template with a thickness of about one micron. The growth of epitaxial crystalline GaN on low temperature, initially polycrystalline GaN or AlN on various lattice mismatched substrates using such two step process has been widely reported (see for example: U.S. Pat. No. 5,633,192; U.S. Pat. No. 4,855,249, MRS Internet J. Nitride Semicond. 5S1, W8.3; MRS Internet J. Nitride Semicond. Res. 8, 5 (2003))

The inventors have found that implantation induced structural changes and partial disorder in the substrate helps relieve stress in the GaN film. This is consistent with the shift to higher frequency of Raman E$_2$ (TO)-high mode and substantial reduction in crack density. In addition, an average crack separation of over 400 μm was measured for a 2 μm thick GaN film on the sample implanted with ion dose of 1×10$^{16}$/cm$^2$ at 75 keV. GaN films on samples without implantation show structural defects along with rough morphology. After implantation and annealing however, the surface morphology of the overgrown GaN film indicates higher quality with defects reduced in size and density. The optical properties of the GaN films grown on implanted AlN/Si substrates were also improved over non implanted substrates with higher near band edge intensity and increased near band edge to yellow luminescence ratio indicative of high crystalline quality. For ion dose of 1×10$^{16}$/cm$^2$ and implantation energy of 75 keV, the Si crystal lattice has been found to be significantly damaged at the peak concentration. Well defined implantation damage was observed in the Si crystal lattice at ~80 nm below the interface. There was no distinct defective layer observed for lower ion dosages but some (Si$_x$N$_y$) precipitates were observed in projected range area of substrate. We believe this partial separation of silicon substrate and AlN/GaN via the defective layer, however small, is primarily responsible for stress reduction in the GaN layer.

Buffer layer thickness also plays a significant role in improving the optical quality and surface condition of the GaN film in the context of our strain management scheme. A close examination of thicker buffers indicates that peak to valley height of the islands change after implantation and annealing; however no noticeable change happens in lateral size of islands (buffer thickness 110 nm and above). An 80% strain reduction measured via Raman Spectroscopy in the GaN film on thinner buffer (e.g. 55 nm) was achieved whereas thicker buffers (110 nm and 165 nm) did not show any reduction in tensile strain. The reduction in strain in the film is also manifested in an increase in crack separation for thinner buffer where as thicker buffers do not show any significant and/or uniform reduction in number of cracks. Further optimization in buffer thickness show even greater reduction of cracks for same implantation conditions (ion energy=75 kev, dose=1×10$^{16}$/cm$^2$). Crack separation in a 2 μm thick overgrown GaN film, increases to over 1 (one) mm for thinner (e.g. 15 nm) AlN buffer layer implanted with ion dose of 1×10$^{16}$/cm$^2$. This implies that the mechanism of stress dilution has strong dependence on the thickness of the AlN buffer layer and sizes of nuclei as well. This is an indication of the possibility that thinner buffers can rearrange and comply with GaN epilayer easier than thicker buffers.

For same buffer thickness (55 nm), varying the energy of implantation has a direct influence on the projected range (i.e., reducing the implantation energy brings the implanted layer closer to the AlN/Si interface) resulting in easier rearrangement of the smaller nuclei in a thinner buffer while complying with GaN epilayer. The calculated screw (N$_S$) and edge (N$_E$) dislocations density obtained from TEM measurements for the non-implanted sample are 3.65×10$^9$ and 8.2× 10$^8$ cm$^{-2}$, respectively. At lower implantation energy (60 keV) and higher dose (2×10$^{16}$/cm$^2$), a significant reduction of both N$_S$ and N$_E$ is observed on nearly crack free GaN film. Both N$_S$ and N$_E$ are reduced by more than one order of magnitude (N$_S$=3.3×10$^8$ cm$^{-2}$ and N$_E$=8.0×10$^7$ cm$^{-2}$). This trend of reduced dislocation defects with implantation energy follows the trend found for dislocation density reduction as measured by AFM. Also, surface RMS roughness of GaN films decreases with decreasing the projected range of implanted ions for higher doses. Both XRD symmetric and asymmetric rocking curves of GaN epilayer show much improved crystal quality on implanted samples as compared to non-implanted ones. Both EPD and XRD support the reduction of dislocation defects in the films overgrown on engineered substrates. Having defective layer in the vicinity of AlN/Si interface, islands can easily migrate and/or reorient during coalescence and therefore reduce the threading dislocations formation which are generated by accommodating the misorientations between island boundaries.

In addition, it was envisioned that the migration and/or alignment of islands in buffer layer can allow the reduction of threading dislocations by complying with epilayer which is difficult to achieve on conventional substrate due to high energy barrier for island migration process. An attempt was made to create a highly defective layer in the AlN/Si interface for 15 nm buffer thickness so that the AlN buffer islands get partially separated from the bulk substrate crystallographically due to implantation induced disorder. The migration/reorientation of the compliant buffer region will allow the structure to come closer to the minimum energy state and reduce the high probability of threading dislocations formation during coalescence of the islands. Experimental results based on above mentioned scheme show that threading dislocations that are generated at the island coalescence are lowered significantly when the defective layer is created on the AlN/Si interface. Both the diffraction pattern and close analysis of the TEM micrograph reveals that implanted layer is polycrystalline in nature implying that either dose is still lower than needed to amorphize the substrate or it has partially recrystallized as a result of the post implantation annealing treatment.

The reduction of edge dislocations could be explained if islands undergo in-plane reorientation when sitting on a defective layer not strictly bonded to the thick Si substrate. The presence of strain field in the islands and dangling bonds on the interface of AlN/Si substrate could facilitate the migration/in-plane reorientation process of the buffer islands. This finding supports the argument that buffer with smaller nuclei as is the case for 15 nm thick buffer can rearrange and reorient to minimize the total energy without having to generate dislocations, provided the nuclei are not strongly bonded to the bulk substrate. It is also believed that creation of complete amorphous layer on the interface could help even further for drastic dislocation defects reduction.

Implantation energy, ion dose and the thickness of the buffer layer are major players in achieving high quality GaN films, once optimized, these can further reduce the dislocation density in the GaN film. Implantation current density (0.2 $\mu A/cm^2$) also seems to have major impact on the quality of GaN film which if higher than an optimum (for the present implantation conditions higher than 0~0.2 $\mu A/cm^2$) can adversely affect the GaN quality instead of improving.

Accordingly, the method of the present invention facilitates monolithic integration of III-V devices on Si. This is highly desirable because Si is an excellent substrate material for III-V optoelectronic devices because of its good mechanical and thermal properties, low cost and the availability of high quality wafers, currently with size up to 12-inch.

The substrate used in the present invention can be silicon, $Al_2O_3$, ZnO, TiN, SOI, $Al_xGa_{1-x}As$ (where x≥0), $Al_xIn_yGa_{1-x-y}N$ (0≤x, y≤1) or any other substrate material that can be made to have a defective layer at or near its interface, e.g. by ion implantation. The buffer layer deposition conditions can be any appropriate conditions that create the desired polycrystalline buffer layer. The type of ions used in the ion implantation can be oxygen ions or other ions, such as, for example, nitrogen or silicon ions, that can be implanted into the substrate to create the defective layer at or near the interface between the buffer layer and the substrate. The buffer layer of the present invention should be compatible (lattice constant and thermal expansion coefficient) with the template layer to be epitaxially grown on it. Preferably, the buffer and template layers comprise materials with closely matched lattice constants and thermal expansion coefficients, in order to minimize the generation of dislocations. The material for the buffer and template layers can be from III-V compounds (including III-V nitrides), II-VI compounds, IV-VI compounds, $Si_xGe_{1-x}$ (0<x<1) and other types of materials that semiconductor devices can be made from. Similarly the devices formed in the epilayer of the present invention can take a wide variety of forms.

What is claimed is:

1. A method of forming a compound semiconductor on a lattice mismatched substrate, comprising:
   depositing a polycrystalline buffer layer on the substrate;
   then creating a defective layer in the substrate at or in a vicinity of an interface of the substrate and the polycrystalline buffer layer through ion implantation;
   then annealing the polycrystalline buffer layer to recover the buffer layer from implantation damage caused by ion implantation; and
   creating a monocrystalline template layer of the compound semiconductor on the buffer layer;
   wherein said compound semiconductor comprises a III-V material; and
   wherein the ion implantation improves grain size uniformity of the polycrystalline buffer layer.

2. The method of claim 1, wherein said defective layer is created by the ion implantation through the polycrystalline buffer layer.

3. The method of claim 1, wherein said defective layer is created by the ion implantation through the back side of the substrate.

4. The method of claim 1, wherein said defective layer comprises an amorphous material and/or a polycrystalline material.

5. The method of claim 1, wherein said II-V material comprises $Al_xIn_yGa_{1-x-y}N$ (0≤x, y≤1).

6. The method of claim 5, wherein said defective layer comprises an amorphous oxide layer created by oxygen ion implantation.

7. The method of claim 6, wherein said polycrystalline buffer layer and said template layer exhibit homoepitaxy.

8. The method of claim 7, wherein said polycrystalline buffer layer and said monocrystalline template layer comprise a same material.

9. The method of claim 1, wherein said monocrystalline template layer is closely lattice matched to the polycrystalline buffer layer.

10. The method of claim 9, wherein said buffer layer serves as a seed layer for growth of said template layer, and further comprising:
    growing a compound semiconductor based device structure on the template layer.

11. The method of claim 10, wherein said compound semiconductor comprises $Al_xIn_yGa_{1-x-y}N$ (0≤x, y≤1).

12. The method of claim 1, wherein said defective layer is created by ion implantation after the buffer layer is deposited on the substrate, and the substrate comprises a material that becomes polycrystalline and/or a material that becomes amorphous by ion implantation.

13. The method of claim 12, wherein said substrate comprises one of: Si, SOI, $Al_2O_3$, ZnO, TiN, and $Al_x Ga_{1-x}As$ (where x≥0).

14. The method of claim 12 wherein said polycrystalline buffer layer comprises AlN.

15. The method of claim 12, wherein said defective layer is created by nitrogen ion implantation.

16. The method of claim 1, further comprising growing an epilayer of the compound semiconductor on the template layer and forming a device structure in said epilayer.

17. A method for growing a compound semiconductor on a substrate, comprising:
    in a substrate supporting a polycrystalline buffer layer already deposited on the substrate, creating a defective layer at or in a vicinity of an interface of the substrate and the buffer layer through ion implantation;
    then annealing the polycrystalline buffer layer to recover the buffer layer from implantation damage caused by ion implantation; and
    growing a compound semiconductor layer on the buffer layer,
    wherein said compound semiconductor comprises a III-V material; and wherein the ion implantation improves grain size uniformity of the polycrystalline buffer layer.

18. The method of claim 17, further comprising controlling at least one of ion implantation conditions and buffer layer thickness to reduce dislocation density in the compound semiconductor.

19. The method of claim 18, wherein both said ion implantation conditions and buffer layer thickness are controlled to minimize said dislocation density.

20. The method of claim 18, wherein said ion implantation conditions comprise ion specie, implantation energy, ion dose and implantation current density.

21. The method of claim 20, wherein the substrate comprises Si and the compound semiconductor comprises $Al_xIn_yGa_{1-x-y}N$ ($0 \leq x, y \leq 1$).

22. The method of claim 20, further comprising forming a device structure in the compound semiconductor.

23. The method of claim 17, wherein the defective layer comprises a polycrystalline material and/or an amorphous material, and the defective layer is created by ion implantation of the substrate in the presence of the polycrystalline buffer layer.

* * * * *

UNITED STATES PATENT AND TRADEMARK OFFICE
CERTIFICATE OF CORRECTION

PATENT NO. : 8,889,530 B2  
APPLICATION NO. : 11/342095  
DATED : November 18, 2014  
INVENTOR(S) : Shahedipour-Sandvik et al.

Page 1 of 1

It is certified that error appears in the above-identified patent and that said Letters Patent is hereby corrected as shown below:

In the Claims

Column 10, Line 20: Claim 5, Delete "II-V" and insert --III-V--

Column 10, Line 40: Claim 12, Delete "1" and insert --11--

Signed and Sealed this  
Seventh Day of April, 2015

Michelle K. Lee  
*Director of the United States Patent and Trademark Office*